(12) United States Patent
Yamaoka et al.

(10) Patent No.: US 8,188,903 B2
(45) Date of Patent: May 29, 2012

(54) RAMP WAVE OUTPUT CIRCUIT, ANALOG/DIGITAL CONVERSION CIRCUIT, AND CAMERA

(75) Inventors: Yuusuke Yamaoka, Osaka (JP); Hiroshi Kimura, Hyogo (JP); Masahiro Higuchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 57 days.

(21) Appl. No.: 12/810,272

(22) PCT Filed: Nov. 25, 2008

(86) PCT No.: PCT/JP2008/003464
§ 371 (c)(1),
(2), (4) Date: Jun. 23, 2010

(87) PCT Pub. No.: WO2009/090703
PCT Pub. Date: Jul. 23, 2009

(65) Prior Publication Data
US 2010/0271248 A1 Oct. 28, 2010

(30) Foreign Application Priority Data
Jan. 18, 2008 (JP) .................................. 2008-009647

(51) Int. Cl.
*H03M 1/56* (2006.01)
(52) U.S. Cl. ......... 341/169; 341/155; 341/167; 341/170
(58) Field of Classification Search .................. 341/118, 341/120, 155, 169, 171
See application file for complete search history.

(56) References Cited

U.S. PATENT DOCUMENTS

| 5,233,245 | A | 8/1993 | Romano et al. | |
|---|---|---|---|---|
| 5,392,456 | A | 2/1995 | Mitomo et al. | |
| 6,255,898 | B1 * | 7/2001 | Ono et al. | 327/551 |
| 7,078,960 | B2 * | 7/2006 | Ezell | 327/553 |
| 7,176,699 | B2 * | 2/2007 | Trochut | 324/677 |
| 7,310,507 | B2 * | 12/2007 | Mizumasa et al. | 455/307 |
| 7,394,305 | B2 * | 7/2008 | Fu et al. | 327/538 |
| 7,528,760 | B2 * | 5/2009 | Forejt | 341/166 |
| 7,573,252 | B1 * | 8/2009 | Griesert | 323/315 |
| 7,767,953 | B2 * | 8/2010 | Yamaoka | 250/214 R |
| 7,804,438 | B2 * | 9/2010 | Krymski | 341/167 |
| 7,940,089 | B2 * | 5/2011 | Chou et al. | 327/60 |
| 8,102,291 | B2 * | 1/2012 | Cheng et al. | 341/143 |
| 2002/0036523 | A1 * | 3/2002 | Tam | 327/131 |
| 2005/0036568 | A1 * | 2/2005 | De Ruijter et al. | 375/316 |
| 2007/0008206 | A1 | 1/2007 | Tooyama et al. | |
| 2007/0038405 | A1 | 2/2007 | Kawabata | |
| 2008/0296473 | A1 | 12/2008 | Yamaoka | |
| 2010/0271248 | A1 * | 10/2010 | Yamaoka et al. | 341/155 |

FOREIGN PATENT DOCUMENTS

| JP | 3-209910 | 9/1991 |
|---|---|---|
| JP | 2000-022990 | 1/2000 |
| JP | 2002-202746 | 7/2002 |
| JP | 2004-096241 | 3/2004 |
| JP | 2006-337139 | 12/2006 |
| JP | 2008-299716 | 12/2008 |

* cited by examiner

*Primary Examiner* — Linh Nguyen
(74) *Attorney, Agent, or Firm* — McDermott Will & Emery LLP

(57) ABSTRACT

A ramp wave output circuit includes a ramp wave generation circuit generating a ramp wave, and a low-pass filter having a variable cutoff frequency, which receives the ramp wave. The low-pass filter operates at a first cutoff frequency for a predetermined time period after the receipt of the ramp wave, and at a second cutoff frequency, which is larger than the first cutoff frequency, after the predetermined time period has passed.

3 Claims, 7 Drawing Sheets

RAMP WAVE OUTPUT CIRCUIT, ANALOG/DIGITAL CONVERSION CIRCUIT, AND CAMERA

RELATED APPLICATIONS

This application is the U.S. National Phase under 35 U.S.C. §371 of International Application No. PCT/JP2008/003464, filed on Nov. 25, 2008, which in turn claims the benefit of Japanese Application No. 2008-009647, filed on Jan. 18, 2008, the disclosures of which Applications are incorporated by reference herein.

TECHNICAL FIELD

The present invention relates to ramp wave output circuits including low-pass filters for removing noise and analog-digital converter circuits including the circuits, and more particularly to ramp wave output circuits capable of expanding linear regions of ramp waves.

BACKGROUND ART

Since analog-digital conversion using a ramp wave can convert numbers of analog signals to digital signals in parallel, much attention has been paid to the conversion as means for increasing speed of a system such as an image sensor, in which large numbers of pixel signals need to be converted to digital signals.

In this technique, analog-digital conversion is performed by comparing an individual analog signal provided to each of comparators and a ramp wave provided commonly to the comparators. Thus, characteristics of the analog-digital conversion largely depend on characteristics of the ramp wave. Therefore, glitch noise, which is usually included in a ramp wave, needs to be removed by a low-pass filter, as described in, e.g., Patent Document 1.

PATENT DOCUMENT 1: Japanese Patent Publication No. 2008-299716
PATENT DOCUMENT 2: Japanese Patent Publication No. 2006-337139

SUMMARY OF THE INVENTION

Technical Problem

However, a low-pass filter distorts the waveform at the starting point of a ramp wave at the same time when removing glitch noise. This degrades conversion characteristics such as reduction in the dynamic range of analog-digital conversion, and an increase in nonlinearity errors. Patent Document 2 shows means for reducing distortion. Specifically, distortion is reduced by (1) generating a square wave for the same time period as a ramp wave, (2) controlling the amplitude of the square wave in accordance with the slope of the ramp wave, and (3) adding the ramp wave to the square wave. However, this requires a square wave generation circuit, a waveform adder, and means for detecting the slope of the ramp wave and for controlling the amplitude of the square wave, thereby increasing the size of the circuit.

In view of the foregoing, it is an objective of the present invention to provide means for easily correcting distortion of the ramp wave at the starting point while removing glitch noise without detecting any slope of the ramp wave. Furthermore, it is also an objective to provide an analog-digital converter circuit including a ramp wave output circuit generating a ramp wave corrected by the above-described means, and a camera including the analog-digital converter circuit.

Solution to the Problem

In order to achieve the objectives, a ramp wave output circuit according to an embodiment of the present invention includes a ramp wave generation circuit generating a ramp wave; and a low-pass filter having a variable cutoff frequency, which receives the ramp wave. The low-pass filter operates at a first cutoff frequency for a predetermined time period after the receipt of the ramp wave, and operates at a second cutoff frequency, which is larger than the first cutoff frequency, after the predetermined time period has passed.

According to this ramp wave output circuit, the ramp wave at an output of the low-pass filter has a delay for the predetermined time period. Thus, the waveform of the ramp wave can be linear to expand a linear region at an earlier time. As such, a ramp wave can be output, of which distortion at the starting point can be corrected while removing glitch noise.

In the ramp wave output circuit according to an embodiment of the present invention, the low-pass filter is configured to switch between resistance values, thereby changing the time constant.

The low-pass filter is a first-order low-pass filter including a first resistor having a first resistance value, a second resistor having a second resistance value larger than the first resistance value, a capacitor, and a switch switching between the first resistance value and the second resistance value.

In the ramp wave output circuit according to an embodiment of the present invention, the low-pass filter is configured to switch between capacitance values, thereby changing the time constant.

The low-pass filter is a first-order low-pass filter including a first capacitor having a first capacitance value, a second capacitor having a second capacitance value larger than the first capacitance value, a resistor, and a switch switching between the first capacitance value and the second capacitance value.

The ramp wave output circuit according to an embodiment of the present invention further includes a replica filter of the low-pass filter, and a first comparator comparing an output of the replica filter and a predetermined voltage. The predetermined time period is determined based on a comparison result by the first comparator.

Due to these features, frequency characteristics of the low-pass filter can be switched at appropriate timing, even if the cutoff frequency of the low-pass filter has variations.

An analog-digital converter circuit according to an embodiment of the present invention includes the ramp wave output circuit of the embodiment of the present invention; a second comparator comparing a voltage value of an input analog signal and a voltage value output from the ramp wave output circuit; and a counter starting countup or countdown in synchronization with the comparison result by the first comparator, receiving the comparison result by the second comparator, and outputting as a digital signal, a count value when the magnitude relationship between the analog signal and the output voltage is reversed.

According to the analog-digital converter circuit, analog-digital conversion effectively using a region having a linear ramp wave can be achieved without depending on variations of the characteristics of the low-pass filter.

A camera according to an embodiment of the present invention includes an imaging plane, in which a plurality of imaging elements photoelectrically converting an image of a subject to electrical signals are arranged in a matrix form; a plurality of second comparators receiving as analog signals, the electrical signals obtained by each of the imaging elements belonging to each column of the imaging plane, and comparing a voltage value of each of the analog signals and a voltage value output from the ramp wave output circuit; a plurality of counters provided in correspondence to the plurality of second comparators, counting up or down in synchronization with a comparison result by the first comparator, receiving the comparison result by each of the plurality of second comparators, and outputting as digital signals, count values when the magnitude relationship between corresponding one of the analog signals and the output voltage is reversed.

These features realize a camera with high image quality and low power consumption.

Advantages of the Invention

As described above, a ramp wave output circuit can be implemented, which can correct distortion of a ramp wave at the starting point while removing glitch noise. As a result, in analog-digital conversion using a ramp wave, degradation of conversion characteristics such as reduction in a dynamic range of the analog-digital conversion and an increase in nonlinearity errors can be reduced.

Figure 1:
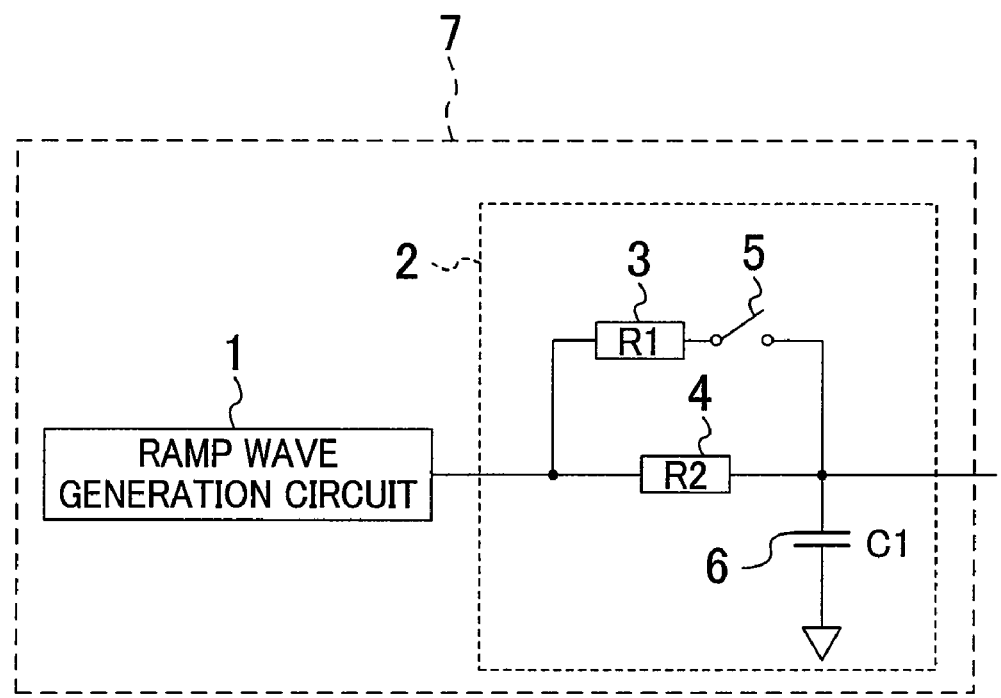
FIG. 1 is a circuit diagram of a ramp wave output circuit of a first embodiment of the present invention.

| DESCRIPTION OF REFERENCE CHARACTERS | |
| --- | --- |
| 1 | Ramp Wave Generation Circuit |
| 2, 2a, 2b, 2c | Low-pass filters |
| 3 | Resistor Having Resistance Value R1 |
| 4 | Resistor Having Resistance Value R2 |
| 5 | Switch |
| 6 | Capacitor Having Capacitance Value C1 |
| 7, 7a, 7b, 7c, 7d | Ramp Wave Output Circuits |
| 8 | Input Waveform to Low-pass filter |
| 9 | Output Waveform from Low-pass filter without Using Present Invention |
| 10 | Output Waveform from Low-pass filter when Using Present Invention |
| 11 | Time at Linear Region Extended by Present Invention |
| 12 | Voltage at Linear Region Increased by Present Invention |

| DESCRIPTION OF REFERENCE CHARACTERS | |
| --- | --- |
| 13 | Capacitor Having Capacitance Value C2 |
| 14 | Replica Filter |
| 15 | Comparator |
| 16 | Step Wave Synchronizing with Start of Ramp Wave |
| 17 | Counter |
| 18 | Comparator |
| 19, 19a | Analog-Digital Converter Circuit |
| 20 | Imaging Plane |
| 21 | Camera |

DESCRIPTION OF EMBODIMENTS

Embodiments of the present invention will be described below.

First Embodiment

FIG. 1 illustrates a circuit configuration of a ramp wave output circuit according to a first embodiment of the present invention.

As shown in FIG. 1, a ramp wave output circuit 7 of this embodiment includes a ramp wave generation circuit 1 and a low-pass filter 2 having the function of changing its characteristics.

The low-pass filter 2 of this embodiment is a low-pass filter having a variable cutoff frequency. Filtering is performed at a first cutoff frequency for a predetermined time period T from the receipt of a ramp wave output from the ramp wave generation circuit 1, and is performed at a second cutoff frequency, which is larger than the first cutoff frequency, after the predetermined time period T has passed. Note that a detailed circuit configuration of the low-pass filter 2 is shown in this FIG. 1 and the following FIGS. 3-5.

The low-pass filter 2 shown in FIG. 1 is a first-order low-pass filter configured to switch between resistance values, and includes a resistor 3, a resistor 4, a switch 5, and a capacitor 6. The resistor 3 having, e.g., a resistance value R1, and the resistor 4 having a resistance value R2, which is sufficiently larger than the resistance value R1, are connected in parallel. The resistor 3 and the switch 5 are connected in series. An end of the capacitor 6 having a capacitance value C1 is connected to the resistor 4 and the switch 5.

The ramp wave output circuit 7 having the above-described configuration turns the switch 5 off before the ramp wave generation circuit 1 starts generating a ramp wave, and maintains the off state. The ramp wave output circuit 7 turns the switch 5 on, when the predetermined time period T=R1C1 has passed after the start of the generation of the ramp wave (at the time of receipt at the low-pass filter). As such, since the cutoff frequency of the low-pass filter 2 is sufficiently low for the predetermined time period T (R1C1) from the start of the generation of the ramp wave, a delay R1C1 can be obtained without changing the waveform at an output node of the low-pass filter 2. Also, a linear waveform can be obtained after the predetermined time period T has passed and the switch 5 is turned on.

Figure 2:
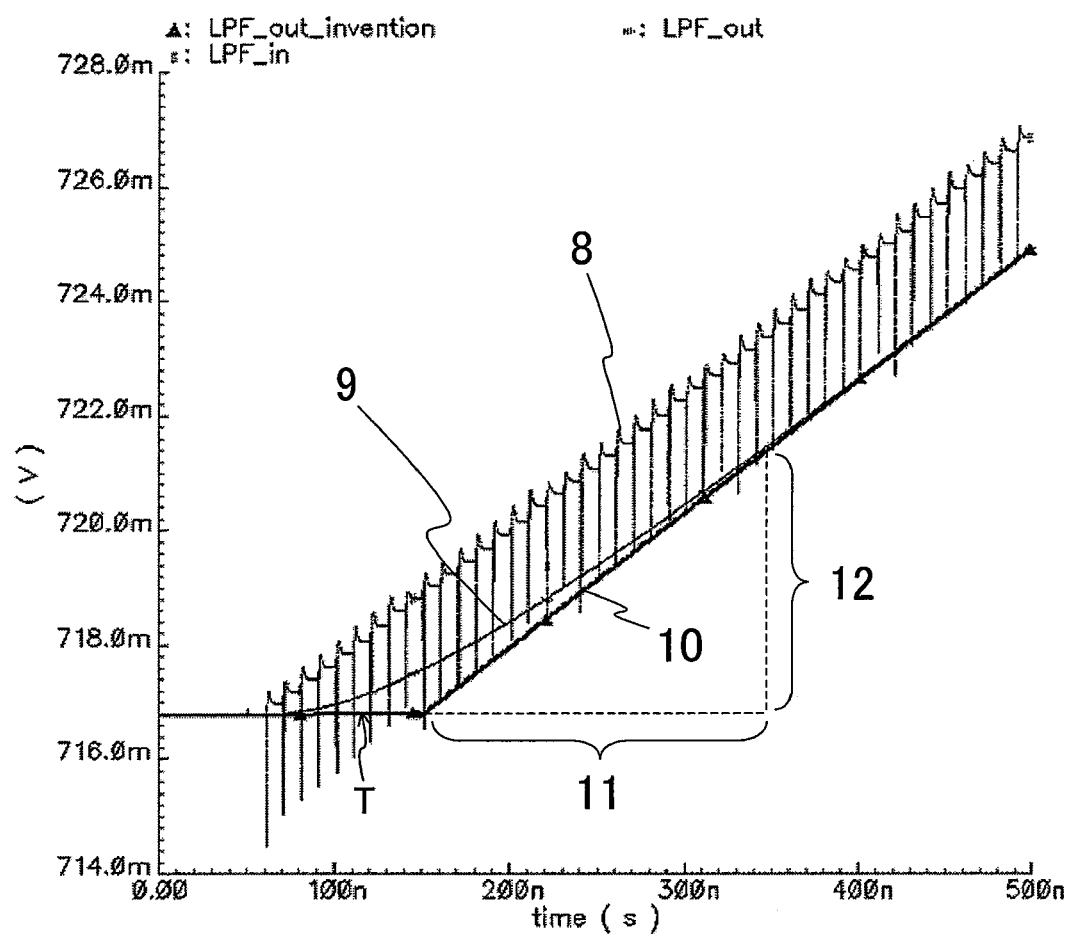
FIG. 2 is a graph illustrating a simulation result showing advantages of a low-pass filter of the first embodiment of the present invention.

FIG. 2 illustrates, as a simulation result, an output waveform from the low-pass filter 2 of the ramp wave output circuit 7 of this embodiment. Note that FIG. 2 also illustrates an output waveform from a low-pass filter of a conventional ramp wave output circuit, as a comparison example of the low-pass filter 2 of this embodiment.

As shown in FIG. 2, a waveform 8, which is input from the ramp wave generation circuit 1 to the low-pass filter 2 of this embodiment, is output as a waveform 10 when passing through the low-pass filter 2 of this embodiment. That is, the waveform 10 presents a delay without changing for the predetermined time period T from the start of the generation of the ramp wave, and becomes a linear waveform after the predetermined time period T has passed. On the other hand, the waveform 8 input similarly is output as a waveform 9 when passing through a conventional low-pass filter. Therefore, as clear from the comparison between the output waveforms 9 and 10, the linear region can be expanded by a time period 11 and by a voltage 12 by using the low-pass filter 2 of this embodiment.

First Variation of Configuration of Low-Pass Filter

Figure 3:
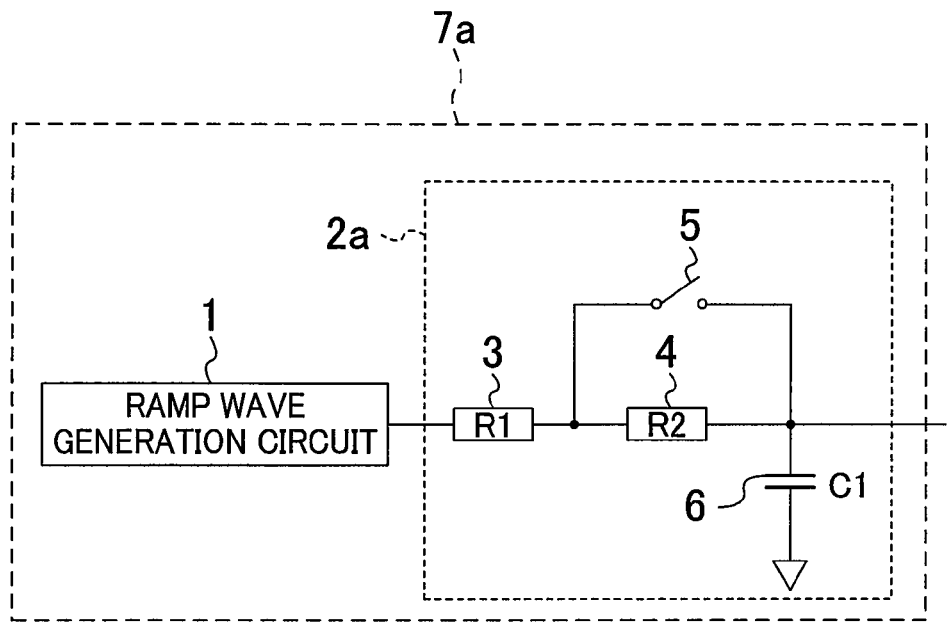
FIG. 3 is a circuit diagram of a first variation of the low-pass filter of the first embodiment of the present invention.

FIG. 3 illustrates a circuit configuration of a ramp wave output circuit 7a including a low-pass filter 2a of this first variation and the above-described ramp generation circuit 1.

As shown in FIG. 3, the low-pass filter 2a of this first variation is a first-order low-pass filter configured to switch between resistance values, and includes a resistor 3, a resistor 4, a switch 5, and a capacitor 6. The resistor 3 having e.g., a resistance value R1, and the resistor 4 having a resistance value R2, which is sufficiently larger than the resistance value R1, are connected in series. The resistor 4 and the switch 5 are connected in parallel. An end of the capacitor 6 having a capacitance value C1 is connected to the resistor 4 and the switch 5.

Similarly, to the above-described case where the low-pass filter 2 is included, the ramp wave output circuit 7a having the above-described configuration turns the switch 5 off before the ramp wave generation circuit 1 starts generating a ramp wave, and maintains the off state. The circuit turns the switch 5 on, when a predetermined time period T has passed after the start of the generation of the ramp wave. As such, similar advantages to those described above with reference to FIG. 2 can be obtained. Specifically, since the cutoff frequency of the low-pass filter 2a is sufficiently low for the predetermined time period T from the start of the generation of the ramp wave, a delay can be obtained without changing the waveform at an output node of the low-pass filter 2a. Also, a linear waveform can be obtained after the predetermined time period T has passed.

Second Variation of Configuration of Low-Pass Filter

Figure 4:
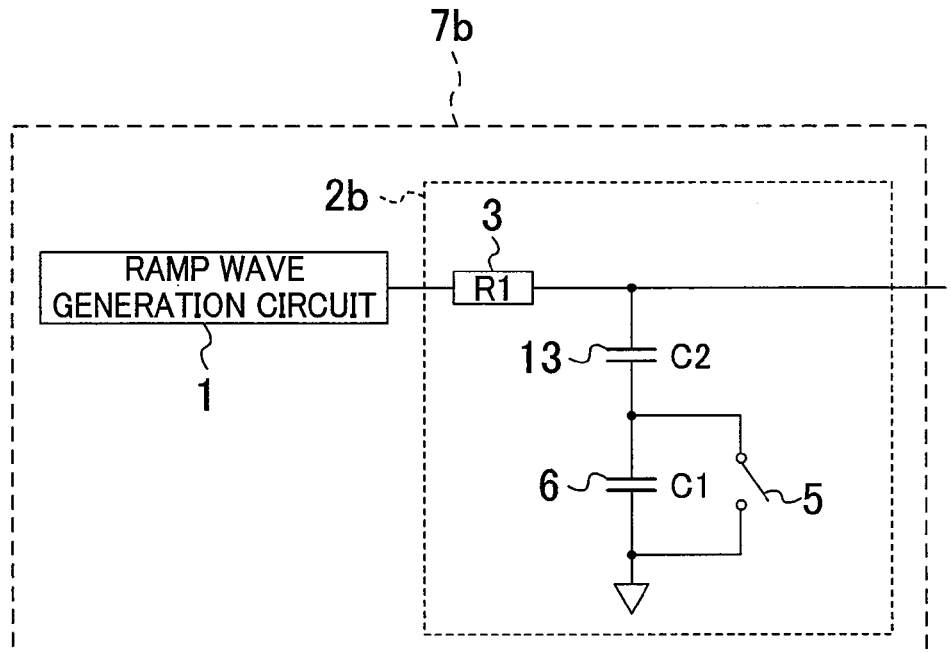
FIG. 4 is a circuit diagram of a second variation of the low-pass filter of the first embodiment of the present invention.

FIG. 4 illustrates a circuit configuration of a ramp wave output circuit 7b including a low-pass filter 2b of this second variation and the above-described ramp generation circuit 1.

As shown in FIG. 3, the low-pass filter 2b of this second variation is a first-order low-pass filter configured to switch between capacitance values, and includes a resistor 3, a switch 5, a capacitor 6, and a capacitor 13. The capacitor 6 having e.g., a capacitance value C1, and the capacitor 13 having a capacitance value C2, which is sufficiently larger than the capacitance value C1, are connected in series. The capacitor 6 and the switch 5 are connected in parallel. An end of the resistor 3 having a resistance value R1 is connected to the ramp generation circuit 1. The other end is connected to the capacitor 13.

The ramp wave output circuit 7b having the above-described configuration turns the switch 5 on before the ramp wave generation circuit 1 starts generating a ramp wave, and maintains the on-state. The circuit turns the switch 5 off, when a predetermined time period T has passed after the start of the generation of the ramp wave (at the time of receipt at the low-pass filter). As such, similar advantages to those described above with reference to FIG. 2 can be obtained. Specifically, since the cutoff frequency of the low-pass filter 2b is sufficiently low for the predetermined time period T from the start of the generation of the ramp wave, a delay can be obtained without changing the waveform at an output node of the low-pass filter 2a. Also, a linear waveform can be obtained after the predetermined time period T has passed.

Third Variation of Configuration of Low-Pass Filter

Figure 5:
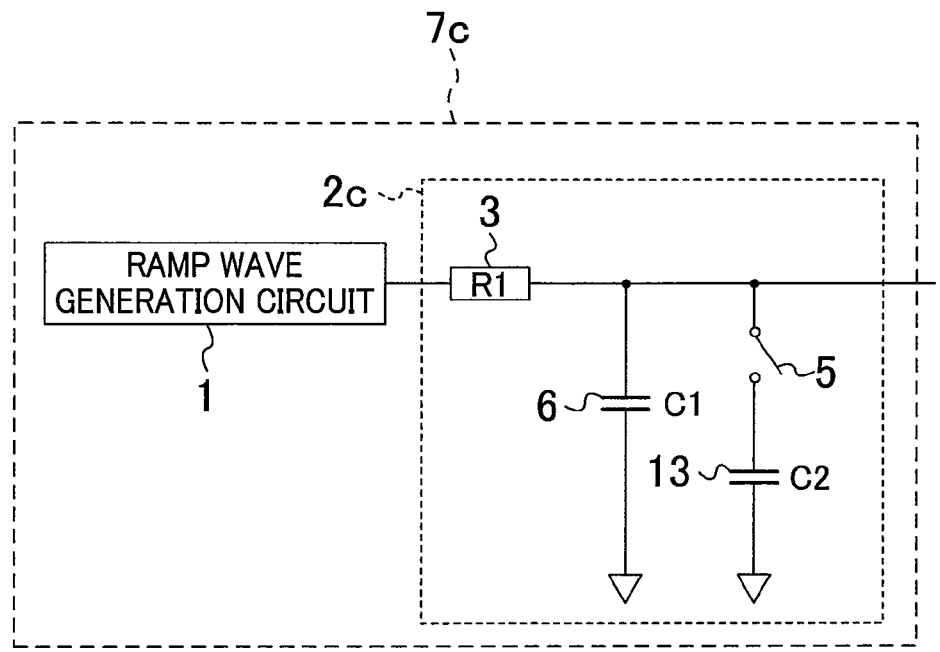
FIG. 5 is a circuit diagram of a third variation of the low-pass filter of the first embodiment of the present invention.

FIG. 5 illustrates a circuit configuration of a ramp wave output circuit 7c including a low-pass filter 2c of this third variation and the above-described ramp generation circuit 1.

As shown in FIG. 5, the low-pass filter 2c of this third variation is a first-order low-pass filter configured to switch between capacitance values, and includes a resistor 3, a switch 5, a capacitor 6, and a capacitor 13. The capacitor 6 having e.g., a capacitance value C1, and the capacitor 13 having a capacitance value C2, which is sufficiently larger than the capacitance value C1, are connected in parallel. The capacitor 13 and the switch 5 are connected in series. An end of the resistor 3 having a resistance value R1 is connected to the ramp generation circuit 1. The other end is connected to the capacitor 6 and the switch 5.

The ramp wave output circuit 7c having the above-described configuration turns the switch 5 on before the ramp wave generation circuit 1 starts generating a ramp wave, and maintains the on-state. The circuit turns the switch 5 off when a predetermined time period T has passed after the start of the generation of the ramp wave (at the time of receipt at the low-pass filter). As such, similar advantages to those described above with reference to FIG. 2 can be obtained. Specifically, since the cutoff frequency of the low-pass filter 2c is sufficiently low for the predetermined time period T from the start of the generation of the ramp wave, a delay can be obtained without changing the waveform at an output node of the low-pass filter 2c. Also, a linear waveform can be obtained after the predetermined time period T has passed.

Figure 6:
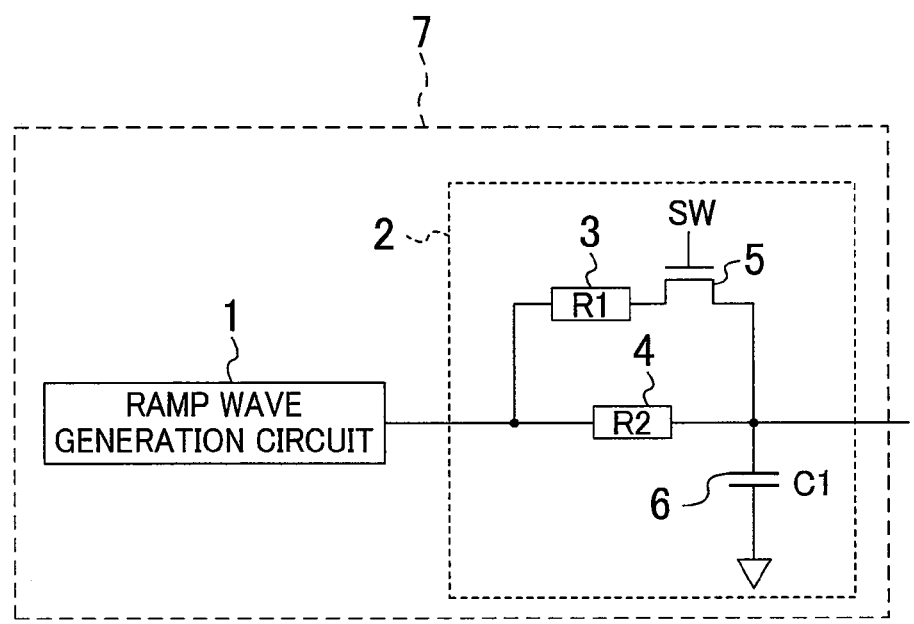
FIG. 6 illustrates another circuit configuration of the low-pass filter of the first embodiment of the present invention.

In the ramp wave output circuits 7 and 7a-7c described above in this embodiment and shown in FIG. 1, and FIGS. 3-5, where on-resistance of a switching transistor is not negligible, the same transistor as in the corresponding figures may be used as the switch 5 in the replica filter as shown in e.g., FIG. 6, which is applied to the configuration in FIG. 1. Note that FIG. 6 is an example, and the configuration is clearly applicable to FIGS. 3-5 as well.

Second Embodiment

Figure 7:
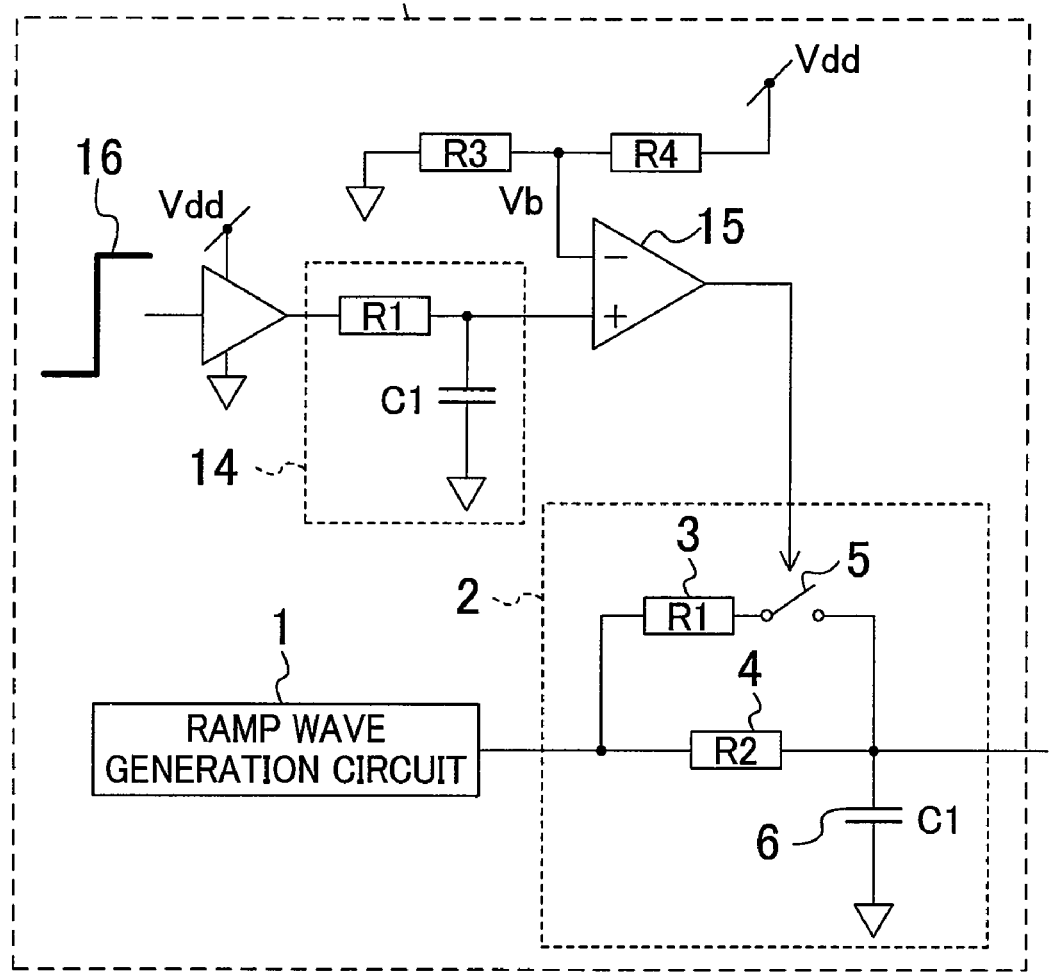
FIG. 7 is a circuit diagram of a ramp wave output circuit of a second embodiment of the present invention.

FIG. 7 illustrates a circuit configuration of a ramp wave output circuit according to a second embodiment of the present invention.

As shown in FIG. 7, a ramp wave output circuit 7d of this second embodiment includes a replica filter 14 and a comparator 15 in addition to the components of the ramp wave output circuit 7 described above with reference to FIG. 1.

The replica filter 14 is the replica filter of the low-pass filter 2 described above with reference to FIG. 1. A step wave 16 synchronizing with the start of the generation of the ramp wave is input to the filter via e.g., a buffer circuit. The comparator 15 compares between an output of the replica filter 14 and a predetermined voltage Vb.

The ramp wave output circuit 7d having the above-described configuration determines the predetermined time period T, after which operation at the first cutoff frequency is switched to operation at the second cutoff frequency, using a result of comparison between the output of the replica filter 14 of the low-pass filter 2 and the predetermined voltage Vb. An optimum predetermined time period T depends only on the characteristics of the low-pass filter 2. In this embodiment, since the information is obtained from the replica filter 14, the predetermined time period T can be optimally determined without depending on variations of the characteristics of the low-pass filter 2. Therefore, frequency characteristics of the low-pass filter can be selected at optimum timing, even if the low-pass filter 2 has various cutoff frequencies.

While in this embodiment, an example has been described where the replica filter 14 is the replica filter of the low-pass filter 2 shown in FIG. 1, replica filters of the low-pass filters corresponding to the ramp wave output circuits shown in FIGS. 3-6 can be also implemented.

Third Embodiment

Figure 8:
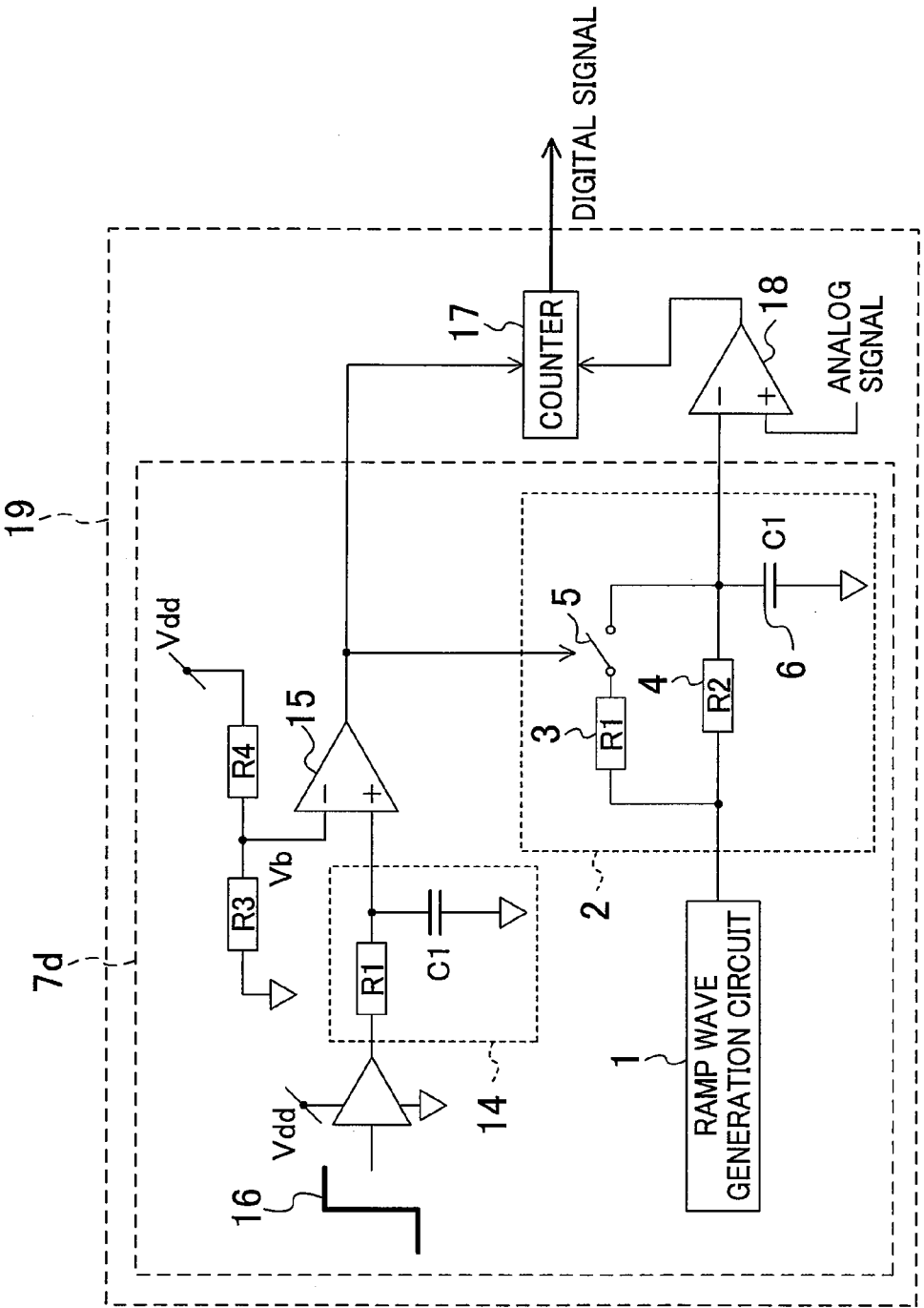
FIG. 8 is a circuit diagram of an analog-digital converter circuit of a third embodiment of the present invention.

FIG. 8 illustrates a circuit configuration of an analog-digital converter circuit according to a third embodiment of the present invention.

As shown in FIG. 8, an analog-digital converter circuit 19 according to the third embodiment of the present invention includes, for example, the ramp wave output circuit 7 described above in the second embodiment, a comparator 18 comparing a voltage value of an input analog signal and a voltage value output from the ramp wave output circuit 7, and a counter 17 starting countup or countdown in synchronization with a comparison result by the comparator 15.

The analog-digital converter circuit according to this embodiment, which has the above-described configuration, receives the comparison result by the comparator 15, and outputs as a digital signal, the count value at the time when the magnitude relationship between the input analog signal and the output voltage is reversed. Thus, analog-digital conversion in which an area having a linear ramp wave can be effectively used, is realized without depending on variations of the characteristics of the low-pass filter 2. This results in reduction in degradation of the conversion characteristics such as reduction in the dynamic range of the analog-digital conversion, and an increase in nonlinearity errors.

Fourth Embodiment

Figure 9:
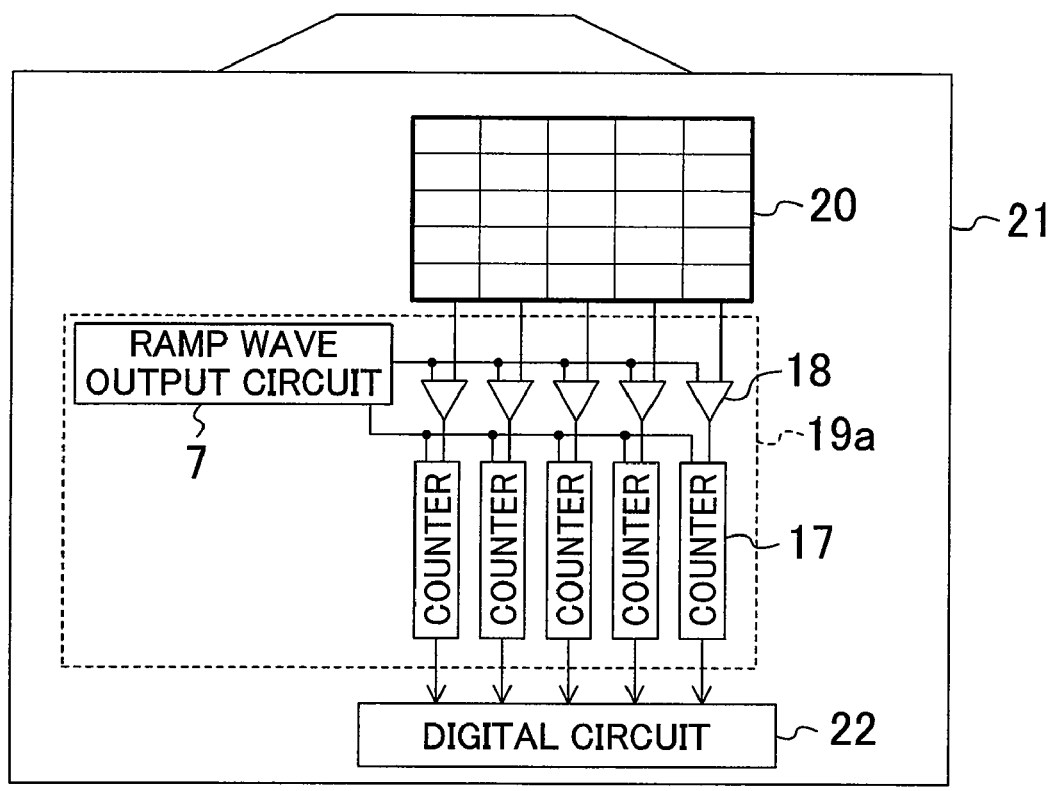
FIG. 9 is a schematic diagram of a camera of a fourth embodiment of the present invention.

FIG. 9 illustrates a schematic configuration of a camera according to a fourth embodiment of the present invention.

As shown in FIG. 9, a camera 21 according to the fourth embodiment of the present invention includes an imaging plane 20 formed by arranging in a matrix form, a plurality of imaging elements, which photoelectrically convert the image of a subject into electrical signals; and an analog-digital converter circuit 19a including the ramp wave output circuit 7 of the above-described second embodiment; a plurality of comparators 18 (see the third embodiment), each of which receives an electrical signal obtained by each of the imaging elements belonging to each column of the imaging plane 20 as an analog signal, and compares between a voltage value of the analog signal and a voltage value output from the ramp wave output circuit 7; and a plurality of counters 17, which are provided in correspondence to the comparators 18, and counting up and counting down in synchronization with a comparison result by the above-described comparator 15.

The camera 21 according to this embodiment having the above-described configuration receives a comparison result by each of the comparators 18, and outputs to a digital circuit 22, each of count values when the magnitude relationship between the corresponding analog signal and output voltage is reversed as a digital signal. Therefore, a camera with high image quality and low power consumption can be realized.

INDUSTRIAL APPLICABILITY

As described above, the present invention is useful for digital convention of pixel signals in a system, in which numbers of analog signals need to be converted to digital signals in parallel, particularly in an image sensor system.

The invention claimed is:

1. A ramp wave output circuit, comprising:
a ramp wave generation circuit generating a ramp wave;
a low-pass filter having a variable cutoff frequency, which receives the ramp wave,
a replica filter of the low-pass filter; and
a first comparator comparing an output of the replica filter and a predetermined voltage,
wherein the low-pass filter operates at a first cutoff frequency for a predetermined time period after the receipt of the ramp wave, and operates at a second cutoff frequency, which is larger than the first cutoff frequency, after the predetermined time period has passed, and
the predetermined time period is determined based on a comparison result by the first comparator.

2. An analog-digital converter circuit comprising:
the ramp wave output circuit of claim 1;
a second comparator comparing a voltage value of an input analog signal and a voltage value output from the ramp wave output circuit; and
a counter starting countup or countdown in synchronization with the comparison result by the first comparator, receiving the comparison result by the second comparator, and outputting as a digital signal, a count value when the magnitude relationship between the analog signal and the output voltage is reversed.

3. A camera comprising:
the ramp wave output circuit of claim 1,
an imaging plane, in which a plurality of imaging elements photoelectrically converting an image of a subject to electrical signals are arranged in a matrix form;
a plurality of second comparators receiving as analog signals, the electrical signals obtained by each of the imaging elements belonging to each column of the imaging plane, and comparing a voltage value of each of the analog signals and a voltage value output from the ramp wave output circuit;
a plurality of counters provided in correspondence to the plurality of second comparators, counting up or down in synchronization with the comparison result by the first comparator, receiving the comparison result by each of the plurality of second comparators, and outputting as digital signals, count values when the magnitude relationship between corresponding one of the analog signals and the output voltage is reversed.

* * * * *